(12) United States Patent
Yang (10) Patent No.: US 11,271,189 B2
(45) Date of Patent: Mar. 8, 2022

(54) ORGANIC LIGHT EMITTING DIODE DISPLAY PANEL WITH A LIGHT FIELD CAMERA

(71) Applicant: WUHAN CHINA STAR OPTOELECTRONICS SEMICONDUCTOR DISPLAY TECHNOLOGY CO., LTD., Wuhan (CN)

(72) Inventor: Hanning Yang, Wuhan (CN)

( * ) Notice: Subject to any disclaimer, the term of this patent is extended or adjusted under 35 U.S.C. 154(b) by 476 days.

(21) Appl. No.: 16/466,647

(22) PCT Filed: Mar. 13, 2019

(86) PCT No.: PCT/CN2019/077905
§ 371 (c)(1),
(2) Date: Jun. 5, 2019

(87) PCT Pub. No.: WO2020/118932
PCT Pub. Date: Jun. 18, 2020

(65) Prior Publication Data
US 2021/0384472 A1 Dec. 9, 2021

(30) Foreign Application Priority Data

Dec. 13, 2018 (CN) .......................... 201811526358.2

(51) Int. Cl.
*H01L 27/32* (2006.01)
*H01L 51/52* (2006.01)
*G02B 3/00* (2006.01)

(52) U.S. Cl.
CPC ........ *H01L 51/5275* (2013.01); *G02B 3/0006* (2013.01); *G02B 3/0087* (2013.01); *H01L 27/3234* (2013.01)

(58) Field of Classification Search
CPC ....................... H01L 27/3232; H01L 27/3234
See application file for complete search history.

(56) References Cited

U.S. PATENT DOCUMENTS

2014/0049822 A1\* 2/2014 Gollier .................. G02B 5/021
359/488.01

\* cited by examiner

*Primary Examiner* — Jae Lee (57) ABSTRACT

An organic light emitting diode (OLED) display panel with a light field camera includes a glass covering plate, an OLED pixel layer, and image sensor. A gradient refractive index lens is formed on the glass covering plate. A refractive index of the gradient refractive index lens gradually varies from a center of the gradient refractive index lens to an outer periphery. The OLED pixel layer is disposed on a bottom surface of the glass covering plate and includes OLED pixel units. A micro lens array is embedded on the OLED pixel layer and includes gradient refractive index micro lenses. A refractive index of each gradient refractive index micro lens gradually varies from a center of the gradient refractive index micro lens to an outer periphery. The image sensor is disposed on a bottom surface of the OLED pixel layer. The light field camera can acquire clear images without focusing.

15 Claims, 6 Drawing Sheets

ORGANIC LIGHT EMITTING DIODE DISPLAY PANEL WITH A LIGHT FIELD CAMERA

FIELD OF INVENTION

The present invention relates to a camera lens, especially to an organic light emitting diode display panel with a light field camera that is configured for electronic devices requiring both a display panel and a telecommunication function such as smart phones or tablets, and has the light field camera without need of a focusing function.

BACKGROUND OF INVENTION

Figure 1:
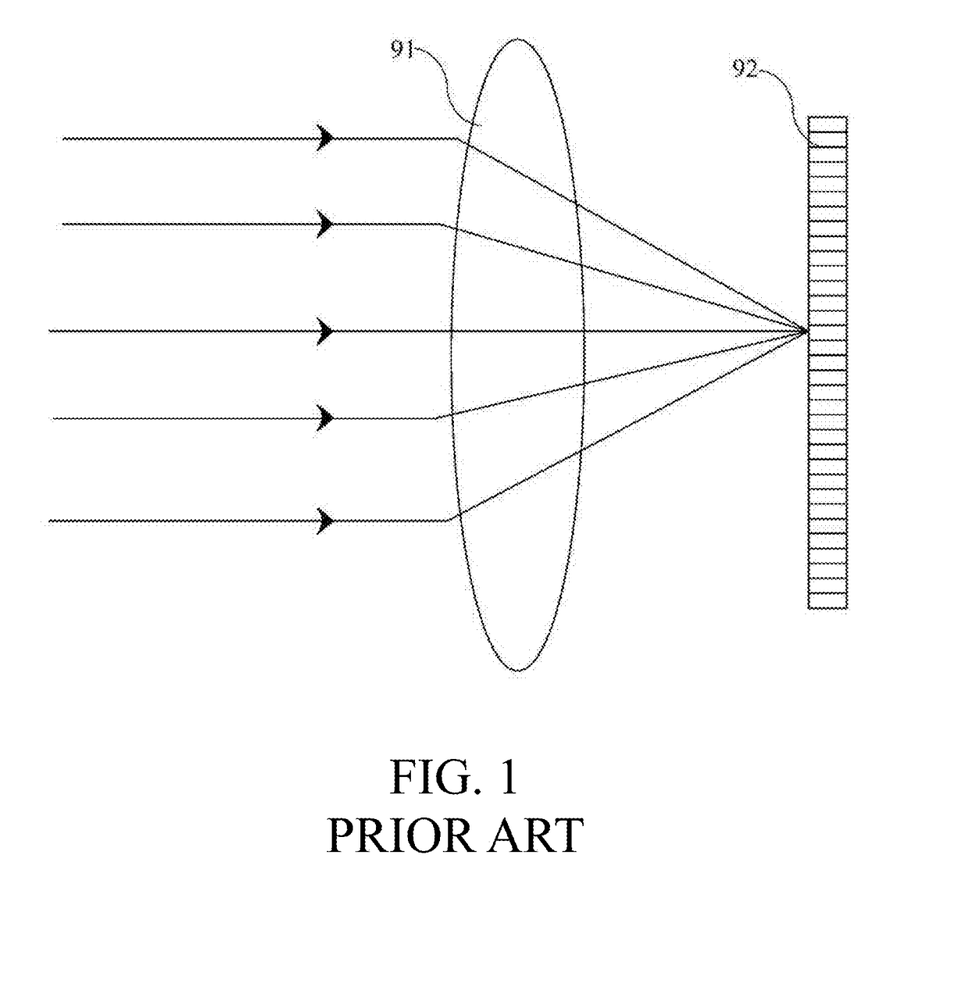
FIG. 1 is a schematic side view of a conventional camera.

With reference to FIG. 1, a conventional camera disposed in a smart phone includes at least one lens 91 and an image sensor 92. External light extending through the lens 91 is concentrated on a position of the image sensor 92 such that light sensor units on the position receive light signals to form pixels. Such an image forming method requires fixing focal plane in advance before forming an image such that shot images has a limitation of a field depth and cannot achieve full clear extent along a depth direction of the image without any blur. In other words, the conventional camera needs to include a focusing module to focus on a subject to be photographed. If the subject is not accurately focused on, an image for the subject produced by the camera will be blurry.

Furthermore, a display panel and a camera of a conventional smart are totally different assemblies and are not incorporated well.

Therefore, it is necessary to provide an organic light emitting diode display panel with a light field camera to solve the issue of the prior art.

SUMMARY OF INVENTION

Technical Issue

In view of technical issues of a conventional camera needing a focusing module for focusing and a display panel of a conventional smart phone not well incorporated with the camera, the present invention provides an organic light emitting diode (OLED) display panel with a light field camera. A glass covering plate of the OLED display panel has a gradient refractive index lens, and an OLED pixel layer of the OLED display panel includes a plurality of gradient refractive index micro lenses, the gradient refractive index lens, the gradient refractive index micro lenses and the image sensor are matched together to form a light field camera without need of a focusing function.

Technical Solution

A main objective of the present invention is to provide an organic light emitting diode (OLED) display panel with a light field camera, comprising:

a glass covering plate, a gradient refractive index lens formed on the glass covering plate, and a refractive index of the gradient refractive index lens gradually varying from a center of the gradient refractive index lens to an outer periphery of the gradient refractive index lens radially;

an OLED pixel layer disposed on a bottom surface of the glass covering plate and comprising a plurality of OLED pixel units, a micro lens array embedded in the OLED pixel layer, the micro lens array corresponding to the gradient refractive index lens and comprising a plurality of gradient refractive index micro lenses, and a refractive index of each of the gradient refractive index micro lenses gradually varying from a center of the gradient refractive index micro lens to an outer periphery of the gradient refractive index micro lens radially; and an image sensor disposed on a bottom surface of the OLED pixel layer and corresponding to the micro lens array.

In an embodiment of the present invention, the refractive index of the gradient refractive index lens gradually decreases from the center of the gradient refractive index lens to the outer periphery of the gradient refractive index lens radially such that the gradient refractive index lens serves as an equivalent convex lens.

In an embodiment of the present invention, the refractive index of the gradient refractive index lens gradually increases from the center of the gradient refractive index lens to the outer periphery of the gradient refractive index lens radially such that the gradient refractive index lens serves as an equivalent concave lens.

In an embodiment of the present invention, the refractive index of each of the gradient refractive index micro lenses gradually decreases from the center of the gradient refractive index micro lens to the outer periphery of the gradient refractive index micro lens radially such that each of the gradient refractive index micro lenses serves as an equivalent convex lens.

In an embodiment of the present invention, the refractive index of each of the gradient refractive index micro lenses gradually increases from the center of the gradient refractive index micro lens to the outer periphery of the gradient refractive index micro lens such that each of the gradient refractive index micro lenses serves as an equivalent concave lens.

In an embodiment of the present invention, a top surface of the gradient refractive index lens is a planar surface, and a bottom surface of the gradient refractive index lens is a planar surface.

In an embodiment of the present invention, a top surface of each of the gradient refractive index micro lenses is a planar surface, and a bottom surface of each of the gradient refractive index micro lenses is a planar surface.

In an embodiment of the present invention, some of the OLED pixel units are blue OLED pixel units, others of the OLED pixel units are red OLED pixel units, and the rest of the OLED pixel units are green OLED pixel units.

In an embodiment of the present invention, the glass covering plate, the OLED pixel layer, and the image sensor are arranged along a light axis, a radiation direction along which the refractive index of the gradient refractive index lens gradually varies is perpendicular to the light axis, and a radial direction along which the refractive index of each of the gradient refractive index micro lenses is perpendicular to the light axis.

Another objective of the present invention is to provide an organic light emitting diode (OLED) display panel with a light field camera, comprising:

a glass covering plate, a gradient refractive index lens formed on the glass covering plate, and a refractive index of the gradient refractive index lens gradually varying from a center of the gradient refractive index lens to an outer periphery of the gradient refractive index lens radially;

an OLED pixel layer disposed on a bottom surface of the glass covering plate and comprising a plurality of OLED pixel units, a micro lens array embedded in the OLED pixel layer, the micro lens array corresponding to the gradient refractive index lens and comprising a plurality of gradient refractive index micro lenses, and a refractive index of each of the gradient refractive index micro lenses gradually varying from a center of the gradient refractive index micro lens to an outer periphery of the gradient refractive index micro lens radially; and an image sensor disposed on a bottom surface of the OLED pixel layer and corresponding to the micro lens array;

wherein a top surface of the gradient refractive index lens is a planar surface, and a bottom surface of the gradient refractive index lens is a planar surface;

wherein a top surface of each of the gradient refractive index micro lenses is a planar surface, and a bottom surface of each of the gradient refractive index micro lenses is a planar surface;

wherein the glass covering plate, the OLED pixel layer, and the image sensor are arranged along a light axis, a radiation direction along which the refractive index of the gradient refractive index lens gradually varies is perpendicular to the light axis, and a radial direction along which the refractive index of each of the gradient refractive index micro lenses is perpendicular to the light axis.

In an embodiment of the present invention, the refractive index of the gradient refractive index lens gradually decreases from the center of the gradient refractive index lens to the outer periphery of the gradient refractive index lens radially such that the gradient refractive index lens serves as an equivalent convex lens.

In an embodiment of the present invention, the refractive index of the gradient refractive index lens gradually increases from the center of the gradient refractive index lens to the outer periphery of the gradient refractive index lens radially such that the gradient refractive index lens serves as an equivalent concave lens.

In an embodiment of the present invention, the refractive index of each of the gradient refractive index micro lenses gradually decreases from the center of the gradient refractive index micro lens to the outer periphery of the gradient refractive index micro lens radially such that each of the gradient refractive index micro lenses serves as an equivalent convex lens.

In an embodiment of the present invention, the refractive index of each of the gradient refractive index micro lenses gradually increases from the center of the gradient refractive index micro lens to the outer periphery of the gradient refractive index micro lens such that each of the gradient refractive index micro lenses serves as an equivalent concave lens.

In an embodiment of the present invention, some of the OLED pixel units are blue OLED pixel units, others of the OLED pixel units are red OLED pixel units, and the rest of the OLED pixel units are green OLED pixel units.

Advantages

Compared to the prior art, the glass covering plate of the OLED display panel of the present invention includes the gradient refractive index lens, and the OLED pixel layer of the OLED display panel includes the gradient refractive index micro lenses, the gradient refractive index lens, the gradient refractive index micro lenses and the image sensor are matched together to form a light field camera without need of a focusing function, each of the gradient refractive index micro lenses generates a sub-image and projects the sub-image to a surface of the image sensor. Each sub-image includes a plurality of pixels, and intensity of light recorded on each of the pixels is from a thin light beam limited between one micro lens and a sub-aperture region of the camera lens. The light field camera utilizes the micro lens array to control additional light beams to record a depth of field of each image, and then projects the small sub-image projection onto the surface of the image sensor such that photographing time is reduced without sacrificing the depth of field and requires no additional focusing module. Furthermore, the OLED display panel of the present invention is incorporated compactly with the light field camera to form a module with a compact structure. Therefore, a cellular phone or tablet adopting the OLED display panel of the present invention can further reduce its dimension in thickness.

In order to make the above contents of the present invention clearer and more understandable, detailed descriptions of preferred embodiments in conjunction with the drawings will be presented as follows.

DETAILED DESCRIPTION OF PREFERRED EMBODIMENTS

Figure 2:
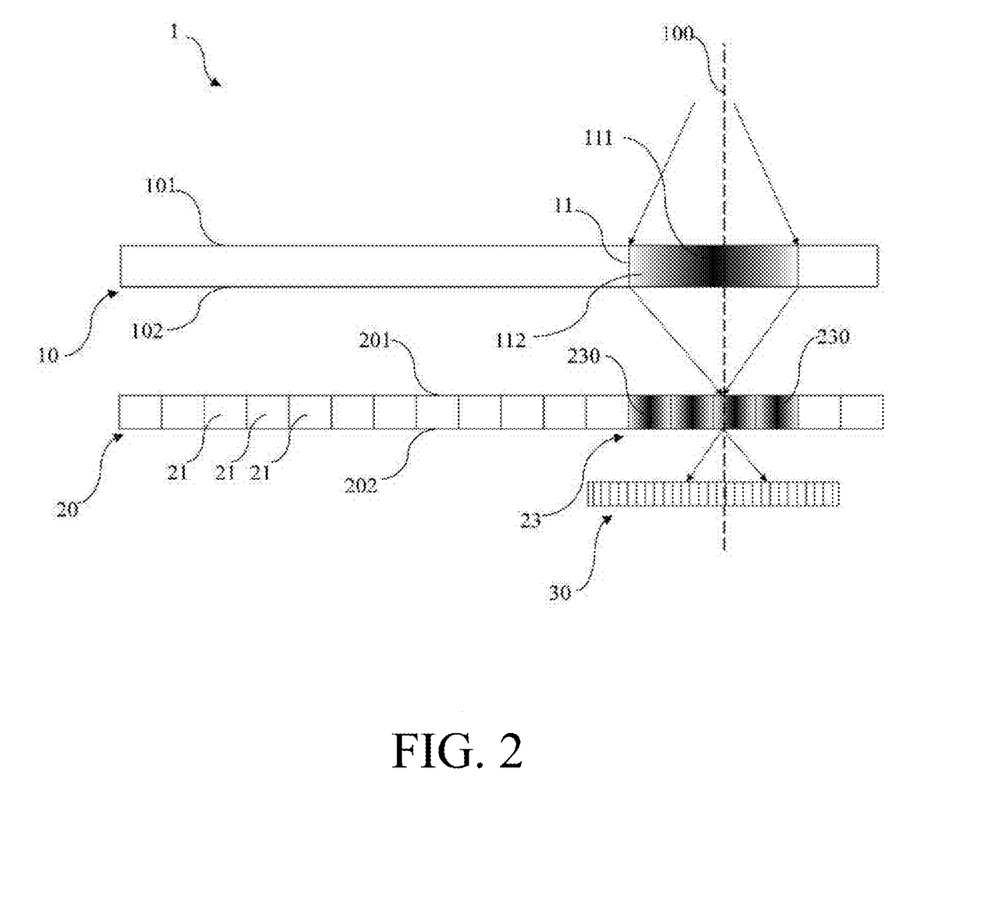
FIG. 2 is a schematic side view of an organic light emitting diode (OLED) display panel with a light field camera of the present invention.

With reference to FIG. 2, an organic light emitting diode (OLED) display panel with a light field camera 1 of the present invention includes a glass covering plate 10, an OLED pixel layer 20, and an image sensor 30.

Figure 3:
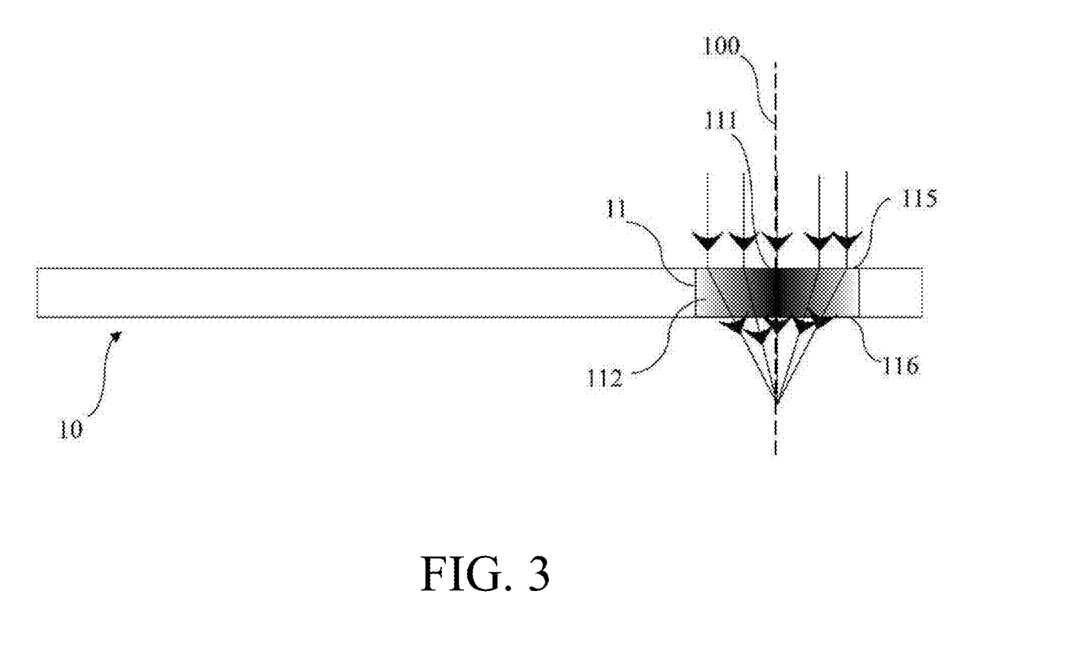
FIG. 3 is a schematic side view of a glass covering plate of the present invention.
Figure 4:
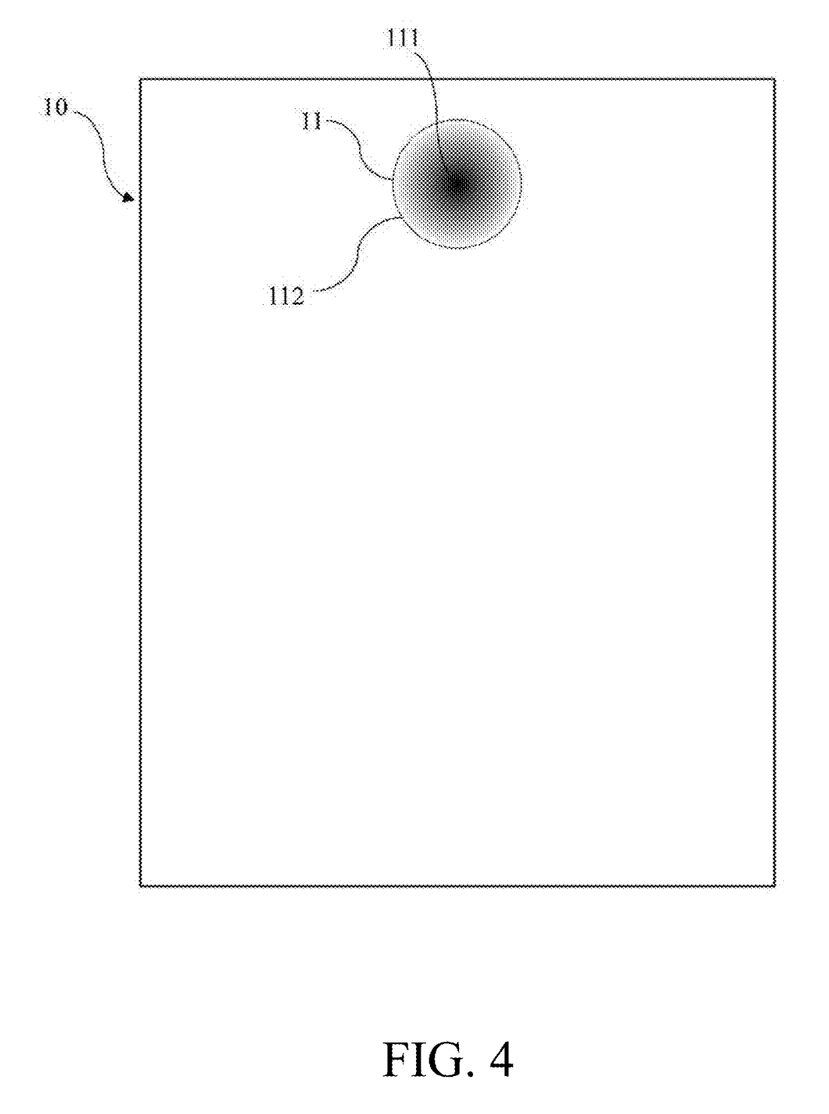
FIG. 4 is a schematic top view of the glass covering plate of the present invention.

With reference to FIGS. 3 and 4, a gradient refractive index lens 11 is formed on the glass covering plate 10. A refractive index of the gradient refractive index lens 11 gradually varies from a center 111 of the gradient refractive index lens 11 to an outer periphery 112 of the gradient refractive index lens 11 radially. In an embodiment of the present invention, the refractive index of the gradient refractive index lens 11 gradually decreases from the center 111 of the gradient refractive index lens 11 to the outer periphery 112 of the gradient refractive index lens 11 such that the gradient refractive index lens 11 serves as an equivalent convex lens. Alternatively, in an embodiment of the present invention, the refractive index of the gradient refractive index lens 11 gradually increases from the center 111 of the gradient refractive index lens 11 to the outer periphery 112 of the gradient refractive index lens 11 such that the gradient refractive index lens 11 serves as an equivalent concave lens. In an embodiment of the present invention, a top surface 115 of the gradient refractive index lens 11 is a planar surface, and a bottom surface 116 of the gradient refractive index lens 11 is a planar surface.

For the inorganic glass covering plate 10, by an ion exchanging process or an ion filling process, ion concentration gradual variation can be achieved in a specific region on the glass covering plate 10 such that the region becomes the gradient refractive index lens 11.

Figure 5:
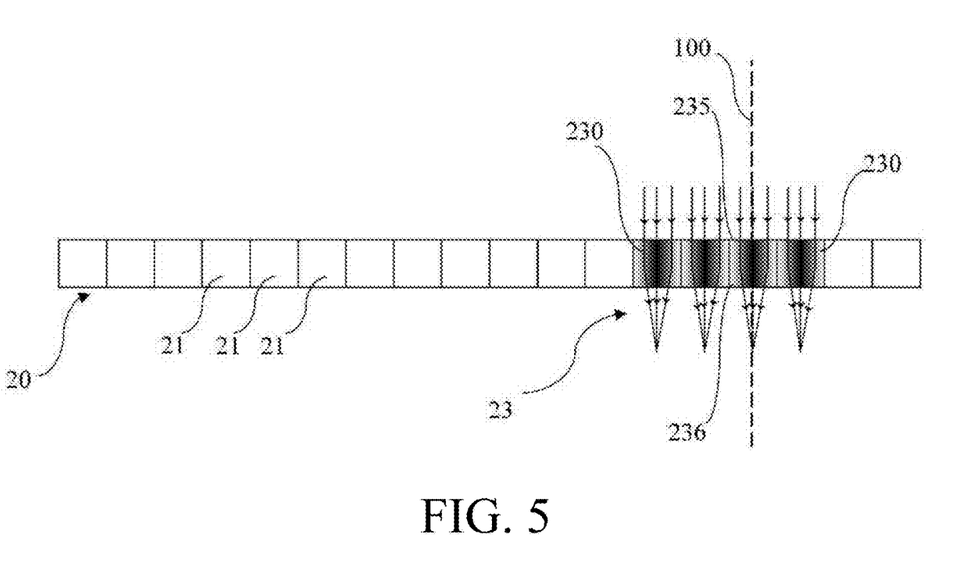
FIG. 5 is a schematic top view of an OLED pixel layer of the present invention.
Figure 7:
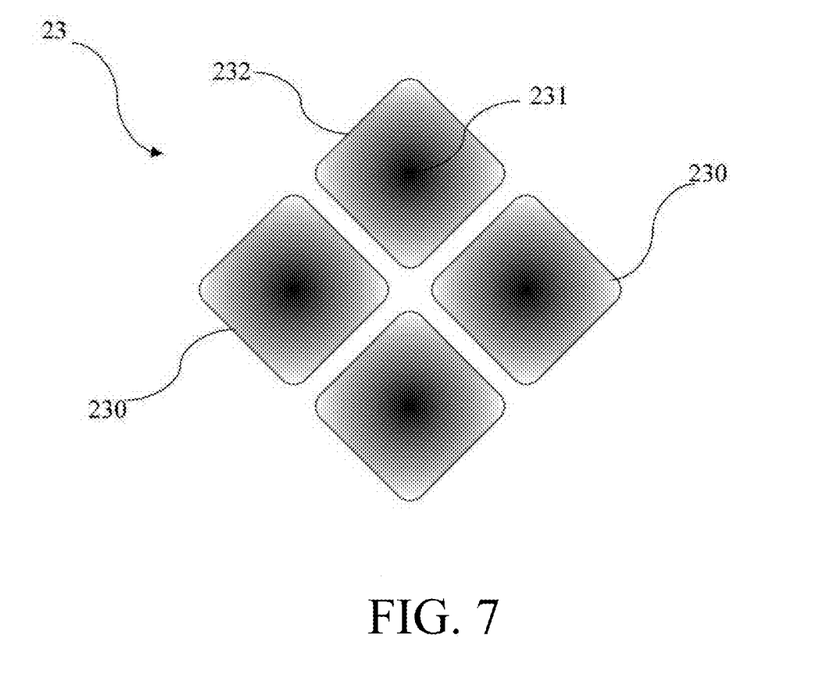
FIG. 7 is a schematic top view of some gradient refractive index micro lenses of the OLED pixel layer the present invention.

With reference to FIGS. 5 and 7, the OLED pixel layer 20 is disposed on a bottom surface 102 of the glass covering plate 10 and includes a plurality of OLED pixel units 21. A micro lens array 23 is embedded in the OLED pixel layer 20. The micro lens array 23 corresponds to the gradient refractive index lens 11 and includes a plurality of gradient refractive index micro lenses 230. A refractive index of each of the gradient refractive index micro lenses 230 gradually varies from a center 231 of each of the gradient refractive index micro lenses 230 to an outer periphery 232 of each of the gradient refractive index micro lenses 230 radially, as shown in FIG. 7. In an embodiment of the present invention, the refractive index of each of the gradient refractive index micro lenses 230 gradually decreases from the center 231 of each of the gradient refractive index micro lenses 230 to the outer periphery 232 of each of the gradient refractive index micro lenses 230 radially such that each of the gradient refractive index micro lenses 230 serves as an equivalent convex lens. Alternatively, in an embodiment of the present invention, the refractive index of each of the gradient refractive index micro lenses 230 gradually increases from the center 231 of each of the gradient refractive index micro lenses 230 to the outer periphery 232 of each of the gradient refractive index micro lenses 230 radially such that each of the gradient refractive index micro lenses 230 serves as an equivalent concave lens. In an embodiment of the present invention, a top surface 235 of each of the gradient refractive index micro lenses 230 is a planar surface, and a bottom surface 236 of each of the gradient refractive index micro lenses 230 is a planar surface.

For the organic OLED pixel layer 20, a spreading process or a photopolymerization process are implemented on places for forming the gradient refractive index micro lenses 230 of the micro lens array 23 to form the gradient refractive index micro lenses 230.

The image sensor 30 is disposed on a bottom surface 202 of the OLED pixel layer 20 and corresponds to the micro lens array 23.

In an embodiment of the present invention, the glass covering plate 10, the OLED pixel layer 20, and the image sensor 30 are sequentially arranged along a light axis 100. A radiation direction along which the refractive index of the gradient refractive index lens 11 gradually varies is perpendicular to the light axis 100, and a radiation direction along which the refractive index of each of the gradient refractive index micro lenses 230 gradually varies is perpendicular to the light axis 100.

Figure 6:
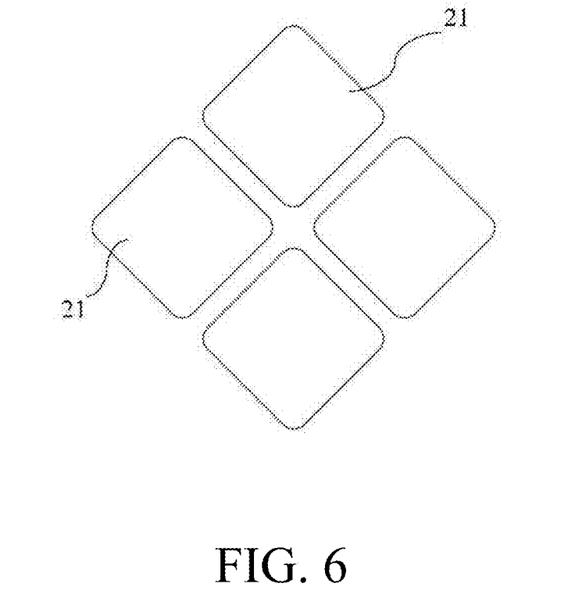
FIG. 6 is a schematic top view of some OLED pixel units of the OLED pixel layer of the present invention.

Furthermore, in an embodiment of the present invention, some of the OLED pixel units 21 are blue OLED pixel units 21, others of the OLED pixel units 21 are red OLED pixel units 21, and the rest of the OLED pixel units 21 are green OLED pixel units 21.

Compared to the prior art, the glass covering plate 10 of the OLED display panel 1 of the present invention includes the gradient refractive index lens 11, the OLED pixel layer 20 of the OLED display panel 1 includes the gradient refractive index micro lenses 230, the gradient refractive index lens 11, the gradient refractive index micro lenses 230, and the image sensor 30 are matched together to form a light field camera without need of a focusing function, each gradient refractive index micro lenses 230 generates a sub-image and projects the sub-image projection to a surface of the image sensor 30. Each sub-image includes a plurality of pixels, and intensity of light recorded on each of the pixels is from a thin light beam limited between one micro lens and a sub-aperture region of the camera lens. The light field camera utilizes the micro lens array 23 to control additional light beams to record a depth of field of each image, and then projects the small sub-image projection onto the surface of the image sensor 30 such that photographing time is reduced without sacrificing the depth of field and requires no additional focusing module. Furthermore, the OLED display panel of the present invention is incorporated compactly with the light field camera to form a module with a compact structure. Therefore, a cellular phone or tablet adopting the OLED display panel of the present invention can further reduce its dimension in thickness.

What is claimed is:

1. An organic light emitting diode display panel with a light field camera, comprising:
   a glass covering plate, a gradient refractive index lens formed on the glass covering plate, and a refractive index of the gradient refractive index lens gradually varying from a center of the gradient refractive index lens to an outer periphery of the gradient refractive index lens radially;
   an organic light emitting diode pixel layer disposed on a bottom surface of the glass covering plate and comprising a plurality of organic light emitting diode pixel units, a micro lens array embedded in the organic light emitting diode pixel layer, the micro lens array corresponding to the gradient refractive index lens and comprising a plurality of gradient refractive index micro lenses, and a refractive index of each of the gradient refractive index micro lenses gradually varying from a center of the gradient refractive index micro lens to an outer periphery of the gradient refractive index micro lens radially; and
   an image sensor disposed on a bottom surface of the organic light emitting diode pixel layer and corresponding to the micro lens array.

2. The organic light emitting diode display panel with a light field camera as claimed in claim 1, wherein the refractive index of the gradient refractive index lens gradually decreases from the center of the gradient refractive index lens to the outer periphery of the gradient refractive index lens radially such that the gradient refractive index lens serves as an equivalent convex lens.

3. The organic light emitting diode display panel with a light field camera as claimed in claim 1, wherein the refractive index of the gradient refractive index lens gradually increases from the center of the gradient refractive index lens to the outer periphery of the gradient refractive index lens radially such that the gradient refractive index lens serves as an equivalent concave lens.

4. The organic light emitting diode display panel with a light field camera as claimed in claim 1, wherein the refractive index of each of the gradient refractive index micro lenses gradually decreases from the center of the gradient refractive index micro lens to the outer periphery of the gradient refractive index micro lens radially such that each of the gradient refractive index micro lenses serves as an equivalent convex lens.

5. The organic light emitting diode display panel with a light field camera as claimed in claim 1, wherein the refractive index of each of the gradient refractive index micro lenses gradually increases from the center of the gradient refractive index micro lens to the outer periphery of the gradient refractive index micro lens such that each of the gradient refractive index micro lenses serves as an equivalent concave lens.

6. The organic light emitting diode display panel with a light field camera as claimed in claim 1, wherein a top surface of the gradient refractive index lens is a planar surface, and a bottom surface of the gradient refractive index lens is a planar surface.

7. The organic light emitting diode display panel with a light field camera as claimed in claim 1, wherein a top surface of each of the gradient refractive index micro lenses is a planar surface, and a bottom surface of each of the gradient refractive index micro lenses is a planar surface.

8. The organic light emitting diode display panel with a light field camera as claimed in claim 1, wherein some of the organic light emitting diode pixel units are blue organic light emitting diode pixel units, others of the organic light emitting diode pixel units are red organic light emitting diode pixel units, and the rest of the organic light emitting diode pixel units are green organic light emitting diode pixel units.

9. The organic light emitting diode display panel with a light field camera as claimed in claim 1, wherein the glass covering plate, the organic light emitting diode pixel layer, and the image sensor are arranged along a light axis, a radiation direction along which the refractive index of the gradient refractive index lens gradually varies is perpendicular to the light axis, and a radial direction along which the refractive index of each of the gradient refractive index micro lenses is perpendicular to the light axis.

10. An organic light emitting diode display panel with a light field camera, comprising:
    a glass covering plate, a gradient refractive index lens formed on the glass covering plate, and a refractive index of the gradient refractive index lens gradually varying from a center of the gradient refractive index lens to an outer periphery of the gradient refractive index lens radially;
    an organic light emitting diode pixel layer disposed on a bottom surface of the glass covering plate and comprising a plurality of organic light emitting diode pixel units, a micro lens array embedded in the organic light emitting diode pixel layer, the micro lens array corresponding to the gradient refractive index lens and comprising a plurality of gradient refractive index micro lenses, and a refractive index of each of the gradient refractive index micro lenses gradually varying from a center of the gradient refractive index micro lens to an outer periphery of the gradient refractive index micro lens radially; and
    an image sensor disposed on a bottom surface of the organic light emitting diode pixel layer and corresponding to the micro lens array;
    wherein a top surface of the gradient refractive index lens is a planar surface, and a bottom surface of the gradient refractive index lens is a planar surface;
    wherein a top surface of each of the gradient refractive index micro lenses is a planar surface, and a bottom surface of each of the gradient refractive index micro lenses is a planar surface;
    wherein the glass covering plate, the organic light emitting diode pixel layer, and the image sensor are arranged along a light axis, a radiation direction along which the refractive index of the gradient refractive index lens gradually varies is perpendicular to the light axis, and a radial direction along which the refractive index of each of the gradient refractive index micro lenses is perpendicular to the light axis.

11. The organic light emitting diode display panel with a light field camera as claimed in claim 10, wherein the refractive index of the gradient refractive index lens gradually decreases from the center of the gradient refractive index lens to the outer periphery of the gradient refractive index lens radially such that the gradient refractive index lens serves as an equivalent convex lens.

12. The organic light emitting diode display panel with a light field camera as claimed in claim 10, wherein the refractive index of the gradient refractive index lens gradually increases from the center of the gradient refractive index lens to the outer periphery of the gradient refractive index lens radially such that the gradient refractive index lens serves as an equivalent concave lens.

13. The organic light emitting diode display panel with a light field camera as claimed in claim 10, wherein the refractive index of each of the gradient refractive index micro lenses gradually decreases from the center of the gradient refractive index micro lens to the outer periphery of the gradient refractive index micro lens radially such that each of the gradient refractive index micro lenses serves as an equivalent convex lens.

14. The organic light emitting diode display panel with a light field camera as claimed in claim 10, wherein the refractive index of each of the gradient refractive index micro lenses gradually increases from the center of the gradient refractive index micro lens to the outer periphery of the gradient refractive index micro lens such that each of the gradient refractive index micro lenses serves as an equivalent concave lens.

15. The organic light emitting diode display panel with a light field camera as claimed in claim 10, wherein some of the organic light emitting diode pixel units are blue organic light emitting diode pixel units, others of the organic light emitting diode pixel units are red organic light emitting diode pixel units, and the rest of the organic light emitting diode pixel units are green organic light emitting diode pixel units.

* * * * *